US008326558B2

(12) United States Patent
Desplats et al.

(10) Patent No.: US 8,326,558 B2
(45) Date of Patent: Dec. 4, 2012

(54) METHOD OF ANALYZING AN INTEGRATED CIRCUIT, METHOD OF OBSERVATION AND THEIR ASSOCIATED INSTALLATIONS (75) Inventors: Romain Desplats, Castanet Tolosan (FR); Kevin Sanchez, Toulouse (FR)

(73) Assignee: Centre National d'Etudes Spatiales, Paris (FR)

( * ) Notice: Subject to any disclaimer, the term of this patent is extended or adjusted under 35 U.S.C. 154(b) by 789 days.

(21) Appl. No.: 12/305,721

(22) PCT Filed: Jun. 19, 2007

(86) PCT No.: PCT/FR2007/001014
§ 371 (c)(1),
(2), (4) Date: Dec. 19, 2008

(87) PCT Pub. No.: WO2007/147968
PCT Pub. Date: Dec. 27, 2007

(65) Prior Publication Data
US 2010/0241379 A1    Sep. 23, 2010

(30) Foreign Application Priority Data
Jun. 19, 2006   (FR) ..................................... 06 05435

(51) Int. Cl.
*G01R 25/00*  (2006.01)
*G06F 11/26*  (2006.01)

(52) U.S. Cl. .............................. 702/72; 702/117; 324/96
(58) Field of Classification Search .................... 702/72, 702/79, 117
See application file for complete search history.

(56) References Cited

U.S. PATENT DOCUMENTS

| 4,698,587    | A  * | 10/1987 | Burns et al. ............... 324/754.23 |
| 6,552,341    | B1 * | 4/2003  | Desplats et al. .............. 250/311 |
| 2003/0020904 | A1 * | 1/2003  | Uto et al. .................... 356/237.2 |
| 2006/0049356 | A1 * | 3/2006  | Shen et al. .................. 250/341.1 |

FOREIGN PATENT DOCUMENTS
FR    2876188    4/2006

OTHER PUBLICATIONS
International Search Report dated Feb. 22, 2008, in PCT application.

* cited by examiner

*Primary Examiner* — Hal Wachsman
(74) *Attorney, Agent, or Firm* — Young & Thompson (57) ABSTRACT

The invention relates to a method for analyzing an integrated circuit, including a step for applying laser radiation at a point on the surface of the circuit, a step for exciting the circuit thus subjected to laser radiation by applying an electrical excitation signal, a step for collecting the response of the circuit to the excitation, the circuit being subjected to laser radiation, and a step for measuring the phase difference between the response to the excitation of the circuit subjected to laser radiation and a reference response of the circuit in the absence of laser radiation applied to the circuit. The invention also relates to an associated observation method and installation.

22 Claims, 8 Drawing Sheets

METHOD OF ANALYZING AN INTEGRATED CIRCUIT, METHOD OF OBSERVATION AND THEIR ASSOCIATED INSTALLATIONS

The present invention relates to a method for analyzing an integrated circuit.

BACKGROUND OF THE INVENTION

Integrated circuits operate at high speed and the slightest internal weakness gives rise to a risk of failure in their overall operation. In the case of circuits used in particularly stressed environments, as encountered in space missions, the radiation environment or temperature stresses, for example, aggravate the sensitivity to weaknesses or to small internal faults.

To determine the weaknesses in integrated circuits, a known technique is to subject to integrated circuits to local laser radiation and evaluate their operation under such a stress.

In particular, a known technique is to excite the circuit with an electrical input signal while it is subjected to laser radiation and check that the result obtained at the output of the circuit is correct. The laser is applied to a small area of the integrated circuit and the test is repeated for several positions of the laser on the surface of the circuit, such that the whole circuit is scanned and a map of the circuit is thus created providing for identifying the areas which, when they are subjected to laser radiation, lead to the circuit producing a non-compliant result at the output.

Such a method is described, for example, in document U.S. Pat. No. 6,483,322 and document U.S. Pat. No. 4,698,587.

These analysis methods are relatively effective, but they allow only significant faults to be detected in the circuit which, when they are subjected to laser radiation, leads to a visible malfunction of the circuit in the sense that it does not provide the expected result.

Furthermore, there is known from document FR 2 876 188 a method and an installation for analyzing an integrated circuit providing for calculating a variation in the time of propagation of the signal through the circuit separating the instant of electrical excitation of the circuit from the instant of collection of the response in the presence and in the absence of laser radiation. By providing a map of propagation delays induced by the presence of the laser, this method produces excellent results on the analysis and characterization of failing circuits. However, this method and this installation require very precise numerical measurements of the delay. This measurement may in certain cases have to be less than about 10 picoseconds, which makes the measurement extremely delicate to implement.

SUMMARY OF THE INVENTION

Thus, an object of the invention is to propose an analysis method and an analysis installation for a circuit providing for measuring more easily the effect of a laser beam on the circuit in operation.

To this end, a subject of the invention is a method for analyzing an integrated circuit, including:
- a step for applying laser radiation at a point on the surface of the circuit;
- a step for exciting the circuit thus subjected to laser radiation by applying an electrical excitation signal;
- a step for collecting the response of the circuit to the excitation, the circuit being subjected to laser radiation;
- a step for measuring the phase difference between the response to the excitation of the circuit subjected to laser radiation and a reference response of the circuit in the absence of laser radiation applied to the circuit.

According to particular embodiments, the analysis method includes one or more of the following characteristics:
- the reference response is the excitation signal of the circuit shifted temporarily with respect to the response of the circuit subjected to laser radiation by a delay equal to the propagation time of the excitation signal through the circuit in the absence of laser radiation;
- the reference response is a signal which is a function of the response expected at the output of the circuit in the absence of laser radiation;
- the reference response is equal to the response expected at the output of the circuit operating normally in the absence of radiation;
- the reference response is a transform of the response expected at the output of the circuit in the absence of radiation, of the same frequency, and for which the amplitude and/or the pulse width and/or the shape of pulses have been modified;
- the step for measuring the phase shift between the response to the excitation of the circuit subjected to laser radiation and a reference response of the circuit in the absence of laser radiation applied to the circuit comprises:
    multiplying the response to the excitation of the circuit subjected to laser radiation by the reference response of the circuit in the absence of laser radiation applied to the circuit; and
    filtering the product obtained through a low-pass filter.

Another subject of the invention is an observation method, characterized in that it includes:
- for a plurality of points on the surface of the integrated circuit, a step for analyzing the circuit, as described above, for the determination of the phase difference between the response to the excitation of the circuit subjected to laser radiation at a point on the surface of the integrated circuit and a reference response of the circuit in the absence of laser radiation applied to the circuit; and
- a step for creating an image of the integrated circuit illustrating a value representing the phase difference between the response to the excitation of the circuit subjected to laser radiation and the reference response of the circuit in the absence of laser radiation applied to the circuit for each point of application of the laser radiation;
- the laser radiation has a wavelength of between 800 nm and 1400 nm;
- the laser radiation wavelength is chosen to be in the group consisting of 1064 nm and 1340 nm;
- the laser radiation is applied at each point synchronously with the circuit excitation step;
- the laser radiation is applied at each point asynchronously with the circuit excitation step; and
- the laser radiation is pulsed with at least one pulse at each point on the circuit.

Another subject of the invention is an installation for analyzing an integrated circuit, including:
- means for applying laser radiation at a point on the surface of the circuit;
- means for exciting the circuit thus subjected to laser radiation by applying an electrical excitation signal;
- means for collecting the response of the circuit to the excitation, the circuit being subjected to laser radiation;
- means for providing a reference response of the circuit in the absence of laser radiation applied to the circuit; and means for measuring the phase difference between the response to the excitation of the circuit subjected to laser radiation and the reference response of the circuit in the absence of laser radiation applied to the circuit.

Lastly, a subject of the invention is an observation installation characterized in that includes:

for a plurality of points on the surface of the integrated circuit, means for analyzing the circuit, as described above, for the determination of the phase difference between the response to the excitation of the circuit subjected to laser radiation at a point on the surface of the integrated circuit and a reference response of the circuit in the absence of laser radiation applied to the circuit; and means for creating an image of the integrated circuit illustrating a value representing the phase difference between the response to the excitation of the circuit subjected to laser radiation and the reference response of the circuit in the absence of laser radiation applied to the circuit for each point of application of the laser radiation.

BRIEF DESCRIPTION OF THE DRAWINGS

The invention will be better understood on reading the following description given purely by way of example and with reference to the drawings in which.

DETIALED DESCRIPTION OF THE PREFERRED EMBODIMENTS

Figure 1:
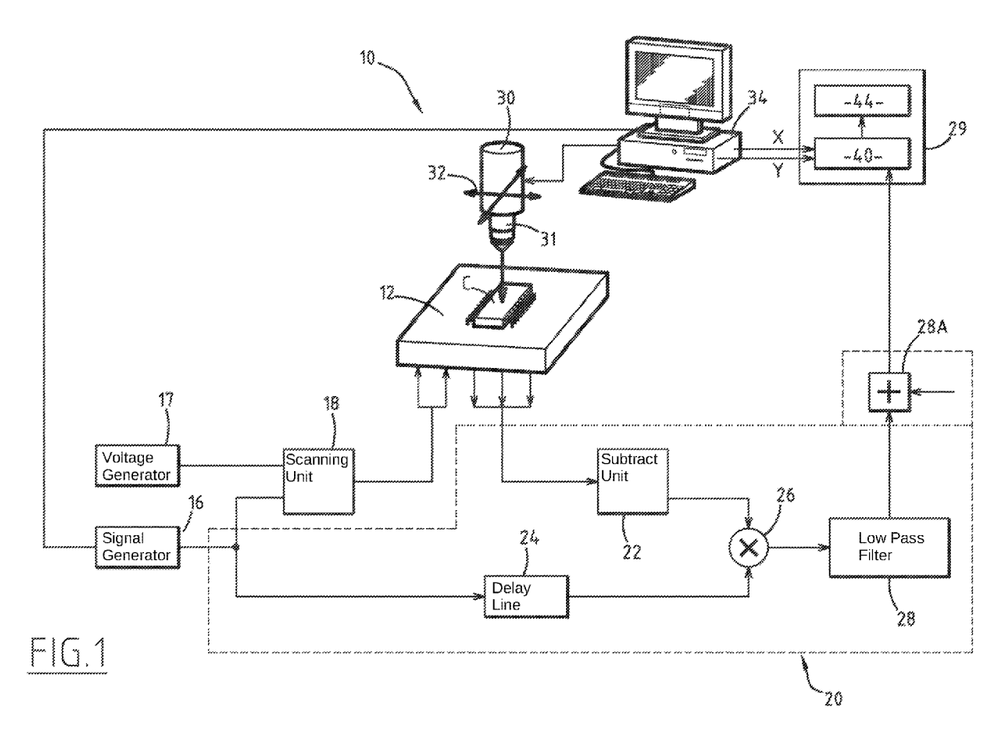
FIG. 1 is a schematic view of a first embodiment of an installation for analyzing a circuit, implementing a method according to the invention.
Figure 3A:
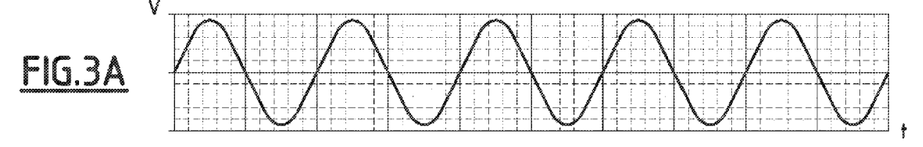
FIGS. 3A, 3B, 3C and 3D are graphs illustrating, respectively, the electrical excitation signal of the circuit, the signal collected at the output of the circuit, the product of the excitation and output signals, and a continuous signal (after stabilisation) representing the phase difference between the delayed excitation signal and the signal collected at the output of the circuit, while the circuit is operating in the absence of laser radiation.

FIG. 1 shows an installation 10 for analyzing and observing an integrated circuit C including a plate 12 for receiving and connecting the integrated circuit and a test signal generator 16 for exciting the circuit. The excitation signal generator 16 is for example a function generator intended to supply a sinusoidal signal, the amplitude of which varies between +1 volt and −1 volt at a determined frequency as illustrated in FIG. 3A.

This excitation signal is for example a clock signal for the circuit C.

The installation also comprises a voltage generator 17, the output of which is connected to the output of the excitation signal generator 16 in order to provide the summing of the signals in a summing unit 18, the output of which is connected to the inputs of the circuit C through the plate 12 in order to supply an input signal. Thus, for example, the input signal at the output of the summing unit 18 is a sinusoidal signal, the amplitude of which is between 0 and +2 volts.

Figure 3B:
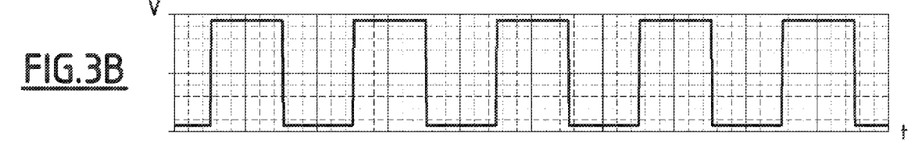

At least one output of the integrated circuit C is connected to a unit 20 for measuring the phase difference or phase shift between the excitation signal of the circuit C and the output signal of this circuit as illustrated in FIG. 3B.

The measurement unit 20 includes at its input a unit 22 for subtracting the DC component of the output signal forming the response of the circuit in order to obtain at the output an alternating signal centred on 0 V.

Furthermore, the unit 20 includes a delay line 24, the input of which is connected to the output of the generator 16 and is intended to supply an excitation signal delayed by a delay τ adjusted to match the duration of processing of the signal by the circuit to be studied in the absence of laser stressing. Preferably, the delay τ is fixed so that the signal delayed by τ arrives in quadrature with the signal studied for the circuit when the circuit is not subjected to laser radiation and when it is operating normally. The delay τ is determined experimentally and is characteristic of an output signal of the circuit.

The outputs of the unit 22 and of the delay line 24 are connected to the inputs of a multiplier circuit 26, the output of which is itself connected to an amplifier with a low-pass filter 28, the cutoff frequency of which is adjusted as a function of the operating frequency of the circuit and the scanning speed of the laser. This frequency is typically in the order of 500 kHz.

The output of the unit 20 is formed by the output of the low-pass filter amplifier 28, which is if necessary combined with a shifting circuit 28A to bring the signal obtained at the output of the filter 28 into a positive value range in order to facilitate its subsequent processing, this signal initially being contained in an interval centered on the value zero.

The output of the filter 28 is connected to an information processing unit 29, formed for example by a computer equipped with an acquisition card.

Furthermore, the installation 10 includes a laser source 30 arranged at right angles to the circuit to be tested and on which a lens 31 is fitted. The laser source 30 is carried by means 32 for moving the laser beam in the plane of the circuit in two directions perpendicular to one another.

The movement means 32 are connected to a driving unit 34 intended to control the position of the laser and to control its triggering.

The driving unit 34 is formed for example by a computer associated with control means.

Furthermore, the driving unit 34 is connected to the test excitation signal generating unit 16 in order to trigger the excitation of the circuit in a manner synchronized with local illumination of the circuit by the laser 30.

According to one embodiment, the laser beam has a wavelength greater than 1100 nm and preferably equal to 1340 nm and is intended to induce a thermal effect in the semiconductor material which is likely to change its local resistivity.

According to another embodiment, the laser beam has a wavelength less than 1100 nm, preferably between 800 nm and 1100 nm, and is intended to induce photoelectric phenomena in the material of the circuit.

Moreover, the laser has a wavelength between 1000 nm and 1400 nm when it passes through a layer of silicon. The transparency of silicon at these wavelengths provides for carrying out analyses through the substrate, without being screened by the metal layers distributed on the surface of the circuit.

In particular, when photoelectric phenomena are highlighted and when the laser passes through a layer of silicon, the laser preferably has a wavelength of 1064 nm, so as to enable the laser radiation to induce the creation of electron-hole pairs in the semiconductor forming the circuit, these electron-hole pairs giving rise to the circulation of a current.

The laser beam has a Gaussian distribution, when it reaches its resolution limit.

The driving unit 34 is connected to the information processing unit 29 in order to supply the coordinates X and Y of the laser beam in the plane of the circuit, these coordinates being representative of the position of the point of impact of the laser beam on the circuit.

The information processing unit 29 includes a real-time storage unit 40 intended to store, during each test carried out on the circuit, the positions X, Y of the point of impact of the laser beam, as well as the phase shift $\phi$ between the circuit excitation signal and the response at the output of the circuit subjected to laser radiation. These storage means are intended to receive this information at a very high rate when they are determined by the unit 20.

The storage means 40 are thus intended to store the triplets (X, Y, $\phi$) for all the points on the circuit. They are connected at the output to means 44 for creating an image of the circuit, this image representing the values of phase shift resulting from the presence of the laser beam tracking the whole surface of the circuit.

The creation 44 of an image of the circuit can take place point-by-point synchronously with the scanning of the laser, the information processing unit transforming the value of the phase shift $\phi$ (voltage measurement) into a colour level of the pixel on the image.

Figure 2:
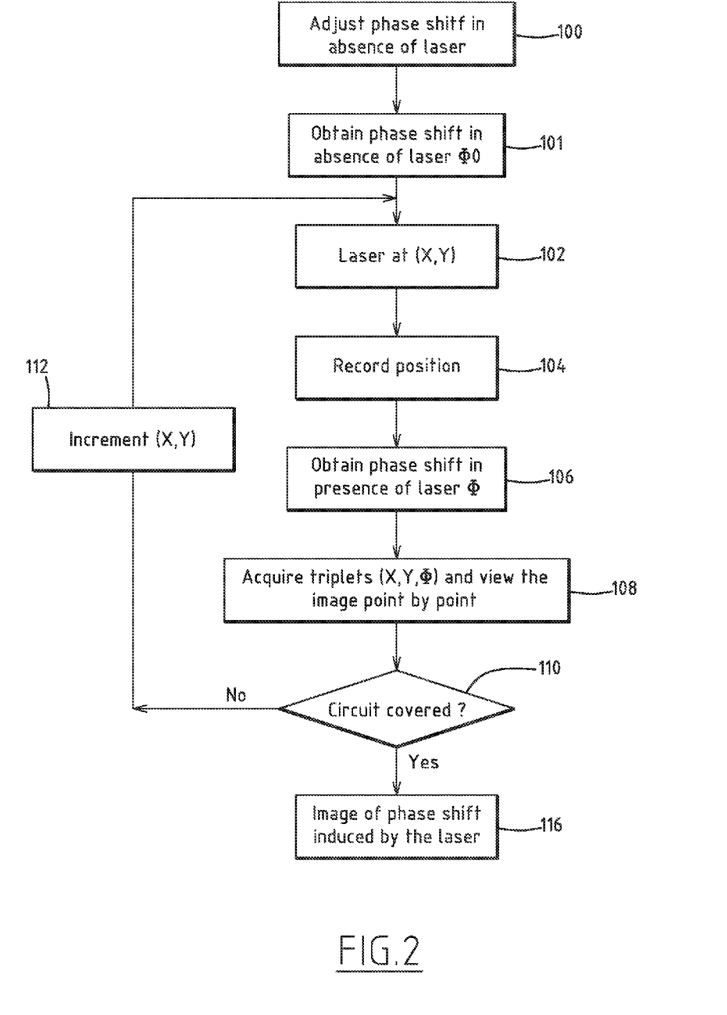
FIG. 2 is a flow chart of the algorithm implemented by the installation of FIG. 1.

The installation of FIG. 1 is intended to implement the algorithm illustrated in FIG. 2.

Initially, at step 100, no laser radiation is applied to the circuit. The input signal takes a reference propagation time $\tau p$ to propagate through the circuit. The phase shift $\phi_0$ between this signal coming from the circuit and the reference signal passing through the delay line 24 is then adjusted by acting on the value $\tau$ of the delay.

The delay value can be adjusted for example using a dichotomy approach with subsequent testing of different delays $\tau$ until a value satisfying the phase shift $\phi_0$ is found.

Another way to proceed is to measure the propagation time $\tau p$ of the reference signal in the circuit. The value of the delay $\tau$ is then chosen directly.

A phase difference or phase shift $\phi_0$ between the excitation signal and the response to the excitation of the circuit in the absence of laser radiation applied to the circuit is then supplied by the circuit 20, at step 101. This phase shift $\phi_0$ is preferably adjusted to a value close to +90° or −90°. In that case, the signal at the output of the filter 28 is substantially zero.

Figure 3C:
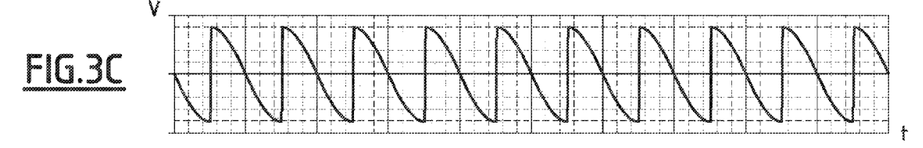
Figure 3D:
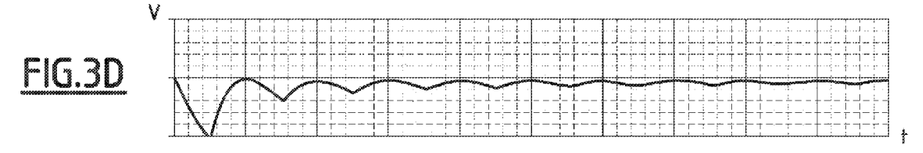

To determine the phase shift $\phi_0$, the delayed excitation signal, illustrated in FIG. 3A, and the response of the circuit, illustrated in FIG. 3B, are multiplied by the multiplier 26 in order to obtain the signal illustrated in FIG. 3C. The phase difference obtained at the output of the filter 28 is illustrated in FIG. 3D. This is very slightly negative in the example in question.

At step 102, the laser is controlled to illuminate a small region of the circuit of coordinates X, Y. At step 104, these coordinates are recorded in the storage means 40. The circuit thus illuminated or illuminated beforehand by the laser beam is excited at step 106 by sending the electrical excitation signal.

In the presence of the laser, the phase difference or phase shift $\phi$ between the delayed excitation signal and the response to the excitation of the circuit is supplied by the circuit 20, at step 106.

Figure 4A:
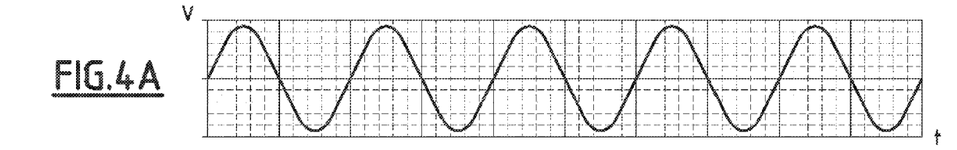
FIGS. 4A, 4B, 4C and 4D, on the one hand, and FIGS. 5A, 5B, 5C and 5D, on the other hand, are views that are identical to those of FIGS. 3A, 3B, 3C and 3D, respectively, in the case when the circuit is stressed by a laser having the effect of a time delay on the response signal and a time advance on the response signal respectively.
Figure 4B:
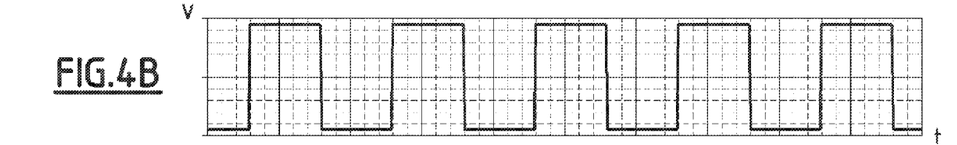
Figure 4C:
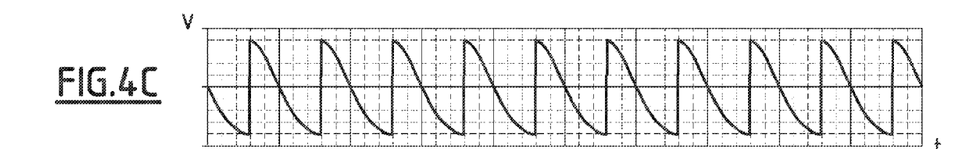
Figure 4D:
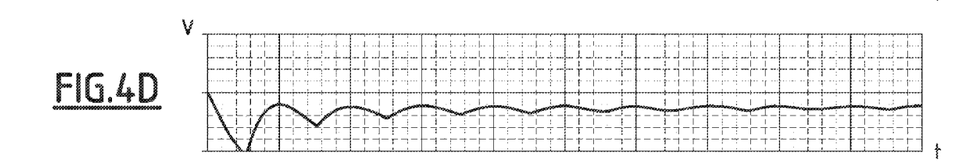
Figure 5A:
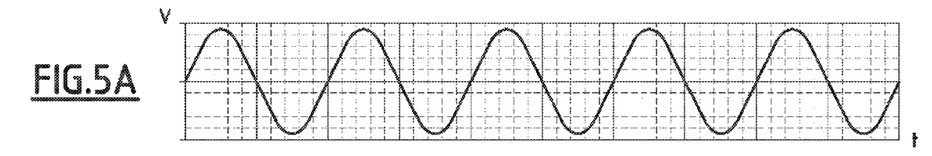
Figure 5B:
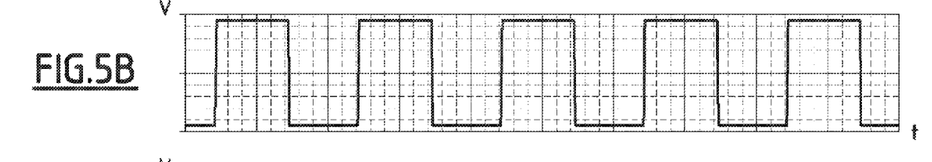
Figure 5C:
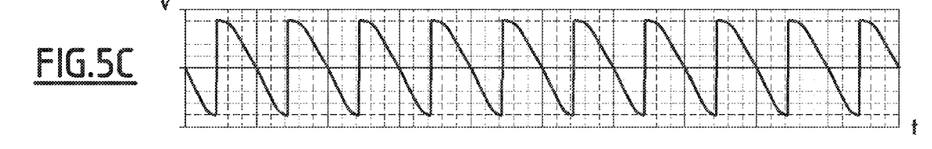
Figure 5D:
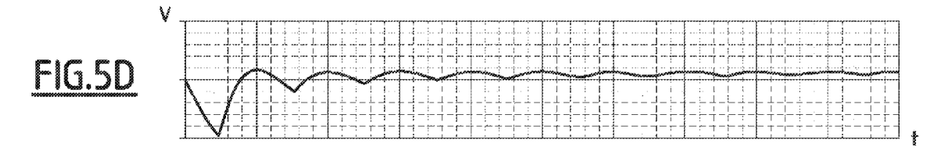

If the action of the laser leads to a delay in the circuit response, as illustrated in FIG. 4B compared with FIG. 3B, a phase delay between the signal is obtained. The phase difference obtained at the output of the filter 28 is illustrated in FIG. 4D. In the opposite case, where the response of the circuit is advanced, as illustrated in FIG. 5B, a phase advance between the two signals is obtained as represented in FIGS. 5C and 5D.

According to a first embodiment of the invention, the laser beam is continuous.

At step 108, the triplets (X, Y, $\phi$) are acquired for each position of coordinates X, Y. The creation 44 of an image takes place point-by-point while the triplets (X, Y, $\phi$) are stored in the storage means 40.

For steps 102 to 108, according to this first embodiment, the laser radiation is applied to a small region of the circuit simultaneously with the application of the test sequence, so that the circuit is illuminated during the test sequence.

According to a second embodiment of the invention, on the other hand, the laser beam is pulsed with pulse durations preferably less than a nanosecond or the laser beam is modulated with pulse durations preferably less than or equal to the duration of the test sequence applied to the circuit. The circuit is then illuminated for predetermined durations of the test sequence.

According to the second embodiment, the test sequence is preferably repeated several times to measure the variation in the propagation time for several different moments of the test sequence.

According to the second embodiment, the laser beam is applied for a predetermined total duration and in a small area of the circuit, either synchronously or asynchronously with the application of the test sequence.

When the applications are referred to as synchronous, the application of the laser starts and ends at fixed and predetermined moments with respect to the start and end of the test sequence.

When the applications are referred to as asynchronous, the application of the laser beam starts and ends at variable and random moments with respect to the start and end of the test sequences.

In the first and second embodiments, steps 102 to 108 are repeated successively for various positions of the point of impact of the laser beam tracking the circuit, so that the laser scans the whole of the circuit. To this end, at step 110, a check is carried out on whether the whole of the circuit has been covered. If this is not the case, the laser is moved at step 112 by the means 32, so that the point of impact is moved slightly and then steps 102 to 108 are repeated. Step 112 is conducted so that, by implementing the loop, the whole of the surface of the circuit is gradually covered.

Figure 6A:
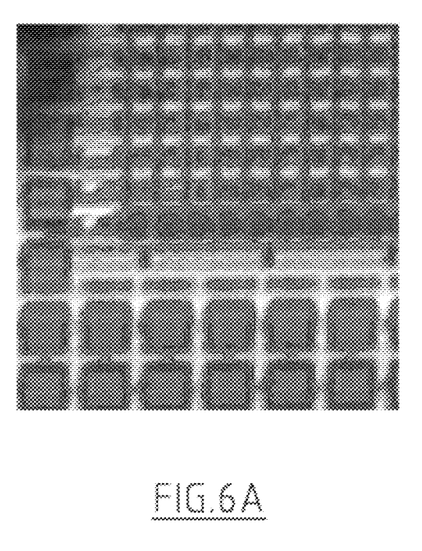
FIGS. 6A and 6B are examples of images of a circuit obtained by implementing the method according to the invention.

At step 116, an image of the circuit is produced by the image creation device 44. Such an image is illustrated in FIG. 6A. On this image, the change in phase difference is illustrated for each of the positions of coordinates X, Y of stressing by the laser beam.

To facilitate visualization of areas of failure or weakness of the circuit, a two-dimensional image in the X and Y axes is extracted from the image illustrated in FIG. 6. On this two-dimensional image, the changes in phase shift $\Phi$ are colourized in different colours.

This two-dimensional image is superimposed on the optical image of the circuit referenced by the coordinates X, Y. This optical image is obtained using the laser 30 or a CCD optical camera.

The presence of the laser beam at a point produces a change or a variation in the phase shift. This is particularly significant for certain areas of the circuit. This variation can be positive or negative depending on the effect of the laser beam, so that, for some areas, the response is obtained more rapidly in the presence of the laser beam while, for other areas, the response is delayed. In some cases, the variation will lead to the propagation of erroneous information in the circuit. The erroneous response of the circuit will itself also be more or less delayed or advanced. Advantageously, the time variation of an erroneous response may be observed on another output of the circuit.

Figure 6B:
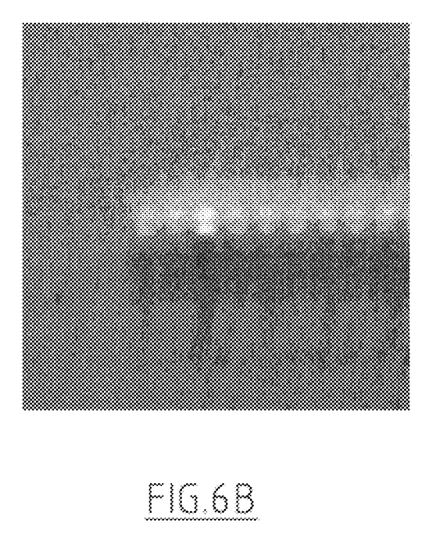

The areas where there is significant variation in phase appear clearly on the image of FIG. 6B and correspond a priori to regions of the circuit which contain faults which are admittedly minor since they are not of the nature that might cause the circuit to produce an erroneous result, but which can turn out to be detrimental for the circuit if operating in a highly stressed environment.

Since the phase shift calculation is obtained by simple multiplication of a reference signal, in this case the excitation signal by the response of the circuit, and by filtering the product signal obtained, it is not necessary to implement a complex time shift calculation which can turn out to be very delicate to set up.

Figure 7:
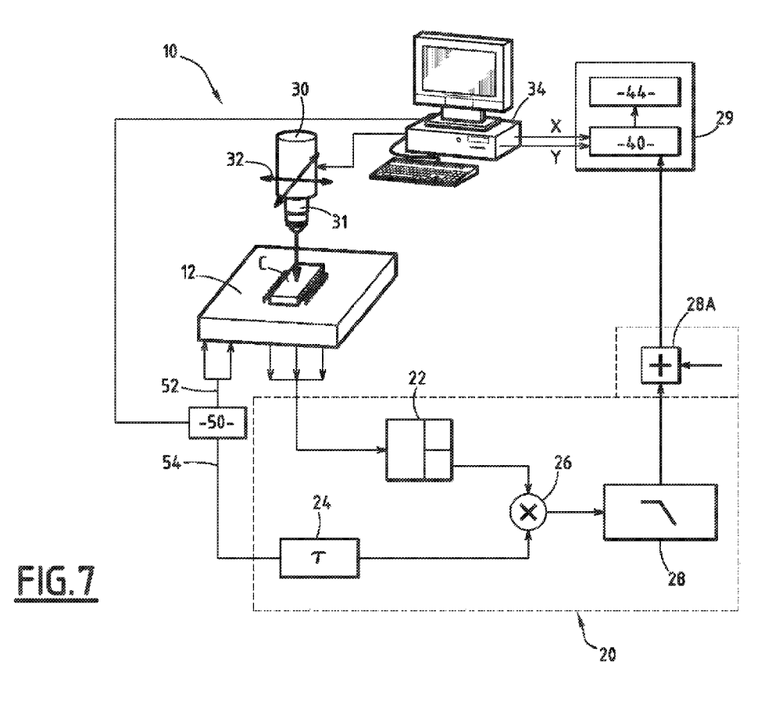
FIG. 7 is a schematic view of a second embodiment of an installation for analyzing a circuit, according to the invention.

As a variant and as represented in FIG. 7, the function generator forming the excitation signal generator 16 is replaced by a tester 50 intended to impose a sequence of predetermined electrical tests on the integrated circuit 16 to be studied and to supply a reference signal for the multiplier circuit 26.

In this embodiment, the tester 50 is intended to supply the test sequence from an output 52, the latter being applied directly to the circuit. On an output 54, the tester is intended to supply a reference signal corresponding to the signal expected at the output of the circuit in the absence of a laser in the case of a circuit operating normally.

This reference signal is obtained by simulation of the circuit according to the first embodiment. In a second embodiment, the reference signal is obtained by direct measurement on a circuit operating normally in the absence of a laser.

Where a tester 50 is used, the delay line 24 is optional since the delay can be set up by the tester itself.

According to the first embodiment, the reference signal has a frequency and a duty cycle equal to that of the output signal expected for the circuit operating normally in the absence of a laser.

Figure 8:
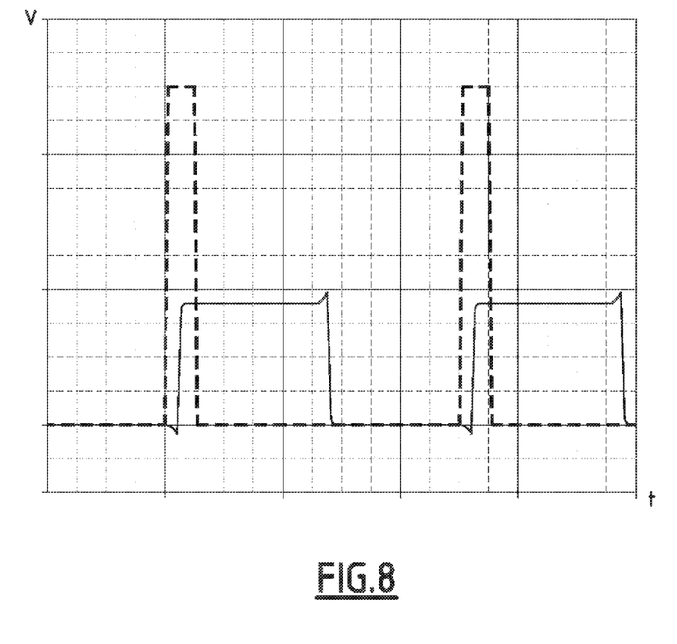
FIG. 8 is a view illustrating the graphs of the reference signal used and of the response signal of the circuit in the embodiment of FIG. 7.

Advantageously, and in order to provide a more accurate analysis of only the rising edge of the response signal of the circuit, the reference signal has a frequency that is identical to that of the expected output signal, but the amplitude and/or the duty cycle and/or the shape of the pulses of the signals is modified. In particular, the pulse width of the reference signal is reduced while its amplitude is increased as illustrated in FIG. 8.

Thus, since the phase shift is calculated by implementing the product of the reference signal and the circuit response signal, this product corresponding to the common area between the two graphs, the phase shift is extremely sensitive to a delay or an advance of the rising edge of the signal, thus providing for a high degree of accuracy in determining variations in phase shift that can be induced by the laser radiation.

Moreover, the phase difference measured by the method according to the invention depends on the initial relative phase shift existing between the response to the excitation of the circuit and the reference response of the circuit, from which the step for measuring the phase difference is calculated.

The phase difference obtained by implementing the method can thus be either the phase delay, i.e. the difference in phases between the rising or falling edges of the signals in the presence and in the absence of laser radiation, or the variation in duty cycle, i.e. the change in the average value of the duty cycle of the signal in the presence and in the absence of laser radiation.

In particular, in the installations described in FIGS. 1 and 7, by fixing to 0° the initial relative phase shift between the response to the excitation of the circuit while the it is not subjected to laser radiation and the reference response of the circuit which by definition is in the absence of laser radiation applied the circuit, the phase difference obtained by implementing the method is equal to the variation in the duty cycle as will be explained later.

However, if the initial relative phase shift between the response to the excitation of the circuit and the reference response of the circuit is fixed to 90°, the phase difference obtained by implementing the method is equal to the phase delay between the rising and falling edges of the signals in the absence and in the presence of laser radiation.

Indeed, if the circuit excitation and response signals are periodic, the signal can be expressed as a sum of sinusoidal functions given by the Fourier series transformation in the form:

$$V_{IC}(t) = a_o + \sum_{1}^{\infty} [a_n \cos(n\varpi t) + b_n \sin(n\varpi t)]$$

$$a_o = \frac{1}{T} \int_0^T V_{IC}(t) dt$$

$$a_n = \frac{2}{T} \int_0^T V_{IC}(t) \cos(n\varpi t) dt$$

$$b_n = \frac{2}{T} \int_0^T V_{IC}(t) \sin(n\varpi t) dt.$$

If the response of the circuit is a square-wave signal of duty cycle equal to 50%, denoted by $V_{IC}$, the reference response is a sinusoidal signal denoted by V1, $V_{IC}$ can be written in the form $$V_{IC}(t) = \sum_o^{\infty} [c_n \cos(n\omega + \theta_n)] \text{ where } c_n = \sqrt{a_n^2 + b_n^2} \text{ ; and } \tan(\theta_n) = \frac{b_n}{a_n}.$$

After the multiplication of the two signals by the stage 26, the two mixed signals, before filtering, are expressed in the form:

$$V_{IC} \cdot V_I = \sum_o^{\infty} [c_n \cos(n\varpi t - \theta_n)] \cdot \cos(\varpi t).$$

After filtering by the low-pass filter $V_{OUT}$, the output of the filter is only a function dependent on the first harmonic, expressed in the form:

$$V_{OUT} = \frac{c_1}{2}\cos(-\theta_1).$$

The expressions mentioned above are assumed to be formed in the absence of alteration due to laser stimulation. When the circuit is subjected to laser radiation, the response of the circuit is modified as regards its harmonics at phase and amplitude level.

Considering that the phase $\theta_1$ and the amplitude $c_1$ are slightly modified around the initial conditions under the action of the laser, variations dc and $d\theta$ which represent, respectively, positive and negatives variations of amplitude and phase for the first harmonic are added so that the output is expressed in the form:

$$V_{OUT} = \frac{c_1 + dc}{2}\cos(-\theta_1 + d\theta).$$

It is thus understood from this formula that the output depends both on the consequences of the laser radiation, i.e. dc and $d\theta$, and on the initial conditions imposed between the two inputs, i.e. $c_1$ and $d\theta$.

Thus, when the two inputs are in phase (in the absence of a laser), the output of the filter is substantially sensitive to the variation in the duty cycle through the value $c_1$.

On the other hand, when the initial phase shift is equal to 90°, the two input signals are in quadrature and the output of the filter is more sensitive to the phase delay through $d\theta$.

Specifically, in each of the conditions, the output values are equal, respectively, to $$V_{OUT00°} = \frac{c_1 + dc}{2}\cos(d\theta) \quad V_{OUT90°} = \frac{c_1 + dc}{2}\sin(d\theta).$$

In FIG. 8, there is represented an installation for simultaneously obtaining the phase delay and the variation in duty cycle due to the exposure of the circuit to laser radiation, without it being necessary to adjust the initial relative phase shift to 0° and to 90°.

To this end, this installation includes the same items as the installation of FIG. 1 to which other items are added.

In particular, the multiplier circuit 26 and the low-pass filter 28 form a first phase difference detector circuit denoted by 102. A second identical phase difference detector circuit denoted by 104 is arranged in the measurement unit 20. This includes, like the circuit 102, a multiplier circuit 126, the output of which is connected to the input of a low-pass filter 128 identical to the filter 28. The multiplier circuit 126 receives, according to a first input, the signal emerging from the output of the subtraction unit 22, i.e. the same input signal as the circuit 26.

A 90° phase shift device 130 is arranged between the output of the delay line 24 and the second input of the multiplier circuit 26 so as to apply at the input of a circuit 104 a reference response phase-shifted by 90° with respect to the reference response applied to the circuit 102.

A shifting circuit 128A is provided at the output of the filter 128 in a manner similar to the shifting circuit 28A.

A calculation unit 150 receives at its input the signals from the two phase difference detector circuits 102 and 104 after the latter have been reprocessed by the shifting circuit 28A and 128A.

The unit 150 is intended to calculate from the phase differences received from the two circuits 102 and 104 the phase delay $d\theta$ and the variation in duty cycle dc.

To this end, the outputs of the circuit 102 and 104 supply values, for the circuit 102 and 104 respectively, expressed in the form:

$$V_{OUT} = \frac{c_1 + dc}{2}\cos(\theta + d\theta)$$

$$V_{OUT(+90°)} = \frac{c_1 + dc}{2}\sin(\theta + d\theta).$$

The circuit 150 is intended to combine these two expressions in order to extract the variations resulting from the laser stimulation for the phase delay $d\theta$ and for the duty cycle dc, the latter being obtained, respectively, from the following relationships:

$$\frac{V_{OUT(+90°)}}{V_{OUT}} = \tan(d\theta)$$

$$\sqrt{V_{OUT}^2 + V_{OUT(+90°)}^2} = \frac{c_1 + dc}{2}.$$

Thus, it is observed that by implementing one or other of the methods, the variations in duty cycle and the phase delay can be measured in simple ways, thus supplying significant information on the dynamic properties of the integrated circuit being tested.

As previously, the information processing unit 29 scans the whole of the circuit and makes available a map of the circuit enabling the values measured for each of the points on the circuit to be made available.

The invention claimed is:

1. A method for analyzing an integrated circuit, comprising:
    applying laser radiation at a point on the surface of the integrated circuit;
    exciting the integrated circuit thus subjected to the laser radiation by applying an electrical excitation signal to the integrated circuit;
    after the exciting step, receiving a response from the integrated circuit as an output signal resulting from the electrical excitation signal, the integrated circuit being subjected to the laser radiation; and
    measuring a phase difference between the response and a reference response, wherein the reference response corresponds to an output from the integrated circuit resulting from a reference application of the electrical excitation signal to the integrated circuit that is free of any laser radiation applied thereto.

2. The method according to claim 1, wherein the reference response is the excitation signal of the integrated circuit shifted temporarily with respect to the response of the integrated circuit subjected to laser radiation by a delay equal to the propagation time of the excitation signal through the integrated circuit in the absence of laser radiation.

3. The method according to claim 1, wherein the reference response is a signal which is a function of a response expected at an output of the integrated circuit in the absence of laser radiation.

4. The method according to claim 3, wherein the reference response is equal to the response expected at the output of the integrated circuit operating normally in the absence of laser radiation.

5. The method according to claim 3, wherein the reference response is a transform of the response expected at the output of the integrated circuit in the absence of laser radiation, of a same frequency, and for which a amplitude and/or a pulse width and/or a shape of pulses have been modified.

6. The method according to claim 1, wherein the measuring step comprises the sub-steps of:
  multiplying the response by the reference response to obtain a product; and
  filtering the obtained product through a low-pass filter.

7. The method according to claim 1, wherein the measuring step is carried out by processing both responses which, in the absence of laser radiation, have a zero initial relative phase shift, in order to obtain, as phase difference, the variation in the duty cycle.

8. The method according to claim 1, wherein the measuring step is carried out by processing both responses, both of which are considered in the absence of laser radiation with a relative phase shift equal to 90°, in order to obtain, as phase difference, the phase delay.

9. The method according to claim 1, further comprising:
  measuring an additional phase difference between the response to the excitation of the integrated circuit subjected to laser radiation and the reference response of the integrated circuit in the absence of laser radiation applied to the integrated circuit and shifted by a predetermined additional phase difference; and
  calculating the phase delay and the variation in duty cycle between the response to the excitation of the integrated circuit subjected to laser radiation and the reference response of the integrated circuit in the absence of laser radiation applied to the integrated circuit from said measured phase difference and said measured additional phase difference.

10. The method according to claim 9, wherein said predetermined additional phase difference is equal to 90°.

11. A method for observing an integrated circuit, further comprising:
  for a plurality of points (X, Y) on the surface of the integrated circuit, analyzing the integrated circuit according to claim 1 for the determination of the phase difference between the response to the excitation of the integrated circuit subjected to laser radiation at a point (X, Y) on the surface of the integrated circuit and the reference response of the integrated circuit in the absence of laser radiation applied to the integrated circuit; and
  creating an image of the integrated circuit illustrating a value representing the phase difference between the response to the excitation of the integrated circuit subjected to laser radiation and the reference response of the integrated circuit in the absence of laser radiation applied to the integrated circuit for each point of application (X, Y) of the laser radiation.

12. The method according to claim 1, wherein the laser radiation has a wavelength of between 800 nm and 1400 nm.

13. The method according to claim 12, wherein the laser radiation wavelength is selected from the group consisting of 1064 nm and 1340 nm.

14. The method according to claim 1, wherein the laser radiation is applied at each point (X, Y) synchronously with the integrated circuit excitation step.

15. The method according to claim 1, wherein the laser radiation is applied at each point (X, Y) asynchronously with the integrated circuit excitation step.

16. The method according to claim 1, wherein the laser radiation is pulsed with at least one pulse at each point (X, Y) on the integrated circuit.

17. An analysis installation, comprising:
  means for applying laser radiation at a point on a surface of an integrated circuit;
  means for exciting the integrated circuit subjected to the laser radiation by applying an electrical excitation signal to the integrated circuit;
  means for receiving a response from the integrated circuit as an output signal resulting from the electrical excitation signal, the integrated circuit being subjected to the laser radiation;
  means for providing a reference response of the integrated circuit, the reference response corresponding to an output from the integrated circuit resulting from a reference application of the electrical signal to the integrated circuit that is free of any laser radiation applied to the integrated circuit; and
  means for measuring a phase difference between the response and the reference response.

18. The analysis installation according to claim 17, wherein the means for measuring the phase difference between the response and the reference response comprise means for carrying out the processing of both responses which, in the absence of laser radiation, have a zero initial relative phase shift, in order to obtain, as phase difference, the variation in the duty cycle.

19. The analysis installation according to claim 17, wherein the means for measuring the phase difference between the response and the reference response comprise means for carrying out the processing of both responses which, in the absence of laser radiation, have a relative phase shift equal to 90°, in order to obtain, as phase difference, the phase delay.

20. The analysis installation according to claim 17, further comprising:
  additional means for measuring an additional phase difference between the response to the excitation of the integrated circuit subjected to laser radiation and the reference response of the integrated circuit in the absence of laser radiation applied to the integrated circuit shifted by a predetermined additional phase difference; and
  means for calculating the phase delay and the variation in duty cycle between the response to the excitation of the integrated circuit subjected to laser radiation and the reference response of the integrated circuit in the absence of laser radiation applied to the integrated circuit from said measured phase difference and said measured additional phase difference.

21. The analysis installation according to claim 20, wherein said predetermined additional phase difference is equal to 90°.

22. An observation installation, comprising:
  for a plurality of points (X, Y) on a surface of an integrated circuit, an installation for analyzing the integrated circuit according to claim 17 for the determination of the phase difference between the response to the excitation of the integrated circuit subjected to laser radiation at a point (X, Y) on the surface of the integrated circuit and a reference response of the integrated circuit in the absence of laser radiation applied to the integrated circuit; and means for creating an image of the integrated circuit illustrating a value representing the phase difference between the response to the excitation of the integrated circuit subjected to laser radiation and the reference response of the integrated circuit in the absence of laser radiation applied to the integrated circuit for each point of application (X, Y) of the laser radiation.

\* \* \* \* \*